United States Patent
Utsumi et al.

(10) Patent No.: US 7,294,198 B2
(45) Date of Patent: Nov. 13, 2007

(54) PROCESS FOR PRODUCING SINGLE-CRYSTAL GALLIUM NITRIDE

(75) Inventors: Wataru Utsumi, Hyogo-ken (JP); Hiroyuki Saitoh, Hyogo-ken (JP); Katsutoshi Aoki, Hyogo-ken (JP)

(73) Assignee: Japan Atomic Energy Research Institute, Kashiwa-Shi (JP)

( * ) Notice: Subject to any disclaimer, the term of this patent is extended or adjusted under 35 U.S.C. 154(b) by 258 days.

(21) Appl. No.: 10/892,131

(22) Filed: Jul. 16, 2004

(65) Prior Publication Data
US 2005/0098089 A1  May 12, 2005

(30) Foreign Application Priority Data
Jul. 29, 2003 (JP) .............................. 2003-281481

(51) Int. Cl.
*C30B 13/00* (2006.01)
(52) U.S. Cl. .............................. 117/73; 117/77; 117/81; 117/82; 117/83; 117/11; 117/952
(58) Field of Classification Search ................. 117/73, 117/77, 81, 82, 83, 11, 952
See application file for complete search history.

(56) References Cited

U.S. PATENT DOCUMENTS

| | | | | |
|---|---|---|---|---|
| 6,110,809 A | * | 8/2000 | Sze et al. | 438/503 |
| 6,270,569 B1 | * | 8/2001 | Shibata et al. | 117/68 |
| 7,112,826 B2 | * | 9/2006 | Motoki et al. | 257/103 |

OTHER PUBLICATIONS

Balkas et al, "Growth and characterization of GaN single crystals", Journal of Crystal Growth 208 (2000) p. 100-106.*
Davydov et al, "Thermodynamic Assessment of the Gallium-Nitrogen System", Phys. Stat. Sol. (a) 188, No. 1, p. 407-410 (2001).*
W. Utsumi, et al., "Congruent melting of gallium nitride at 6 GPa and its application to single-crystal growth," *Nature Materials*, vol. 2, Nov. 2003, pp. 735-738.

* cited by examiner

*Primary Examiner*—Robert Kunemund
*Assistant Examiner*—Matthew J. Song

(57) ABSTRACT

A process for producing single-crystal gallium nitride comprising the steps of performing congruent melting of gallium nitride at a high pressure between $6 \times 10^4$ atm. and $10 \times 10^4$ atm. and at a high temperature between 2,200° C. and 2,500° C. and then slowly cooling the obtained gallium nitride melt at the stated high pressure.

18 Claims, 1 Drawing Sheet

PROCESS FOR PRODUCING SINGLE-CRYSTAL GALLIUM NITRIDE

BACKGROUND OF THE INVENTION

This invention relates to a process for producing single crystals of gallium nitride that can be used as semiconductor substrates for blue light emitting devices. The process is characterized by performing congruent melting of gallium nitride under high-temperature ($\geq 2,200°$ C.) and high-pressure ($\geq 6 \times 10^4$ atm.) conditions and then slowly cooling the obtained gallium nitride melt under the stated high-pressure condition.

High-quality gallium nitride crystals are needed in the development of devices emitting blue or shorter-wavelength light. Today's gallium nitride based devices are deposited on sapphire or other dissimilar crystal substrates and the many dislocations that occur due to the mismatches in lattice constants and thermal expansion coefficients present difficulty in enhancing the device capabilities. Under the circumstances, a strong need exists for larger and better-quality gallium nitride single-crystal substrates that permit thin film growth by homoepitaxy. However, no single-crystal gallium nitride has yet been obtained that meets this need.

A comprehensive review of the technologies available in the art of interest has been made in several books, including "Aoiro Hakko Debaisu no Miryoku (The Charm of Blue Light Emitting Devices)", edited and written by Isamu Akazaki, Kabushiki Kaisha Kogyo Chosakai, pp. 107-185, published on May 1, 1997. However, no disclosure is made of single-crystal gallium nitride that satisfies the aforementioned need.

The standard technique for obtaining large single crystals is by slowly cooling the melt until it recrystallizes as is commonly performed with silicon. However, this approach is not applicable to gallium nitride since it decomposes into nitrogen and gallium at elevated temperature. Therefore, in the previous studies, synthesis has been attempted by other methods including vapor-phase growth and the use of sodium flux but no single-crystal gallium nitride has been successfully grown that has a sufficient size and quality to permit use as substrates.

A Polish group has published a method that yields single-crystal gallium nitride by reacting high-pressure nitrogen gas at about $2 \times 10^4$ atm. with liquid gallium. However, this method permits only a slow growth rate and involves difficulty in growing large single crystals. In order to obtain larger and better-quality single crystals of gallium nitride, the growth of a single crystal by slowly cooling the melt is essential and it was by employing high pressure of at least $6 \times 10^4$ atm. that the present inventors enabled the production of single-crystal gallium nitride involving the slow cooling of the melt.

SUMMARY OF THE INVENTION

According to the present invention, a gallium nitride powder is compressed to at least $6 \times 10^4$ atm. and heated to at least $2,200°$ C. at that elevated pressure by means of a high-temperature and high-pressure generator so that the gallium nitride is melted as such, or undergoes congruent melting, without being decomposed into the constituent elements and the resulting melt is thereafter cooled slowly at the elevated pressure to produce single-crystal gallium nitride.

In the present invention, the production of single-crystal gallium nitride is performed at pressures of $6 \times 10^4$-$10 \times 10^4$ atm. and at temperatures of $2,200°$ C.-$2,500°$ C. The invention requires high pressures of at least $6 \times 10^4$ atm. and in order to be melted, gallium nitride must be heated to at least $2,200°$ C. which is its melting at the stated high pressure. At conditions exceeding $10^5$ atm. or $2,500°$ C., it is difficult to secure large volumes of sample or realize the generation of consistent temperature, making the process unsuitable for the purposes of the present invention.

According to the process of the invention, larger and better-quality single-crystal gallium nitride can be efficiently produced in short periods of time.

DETAILED DESCRIPTION OF THE INVENTION

Figure 1:
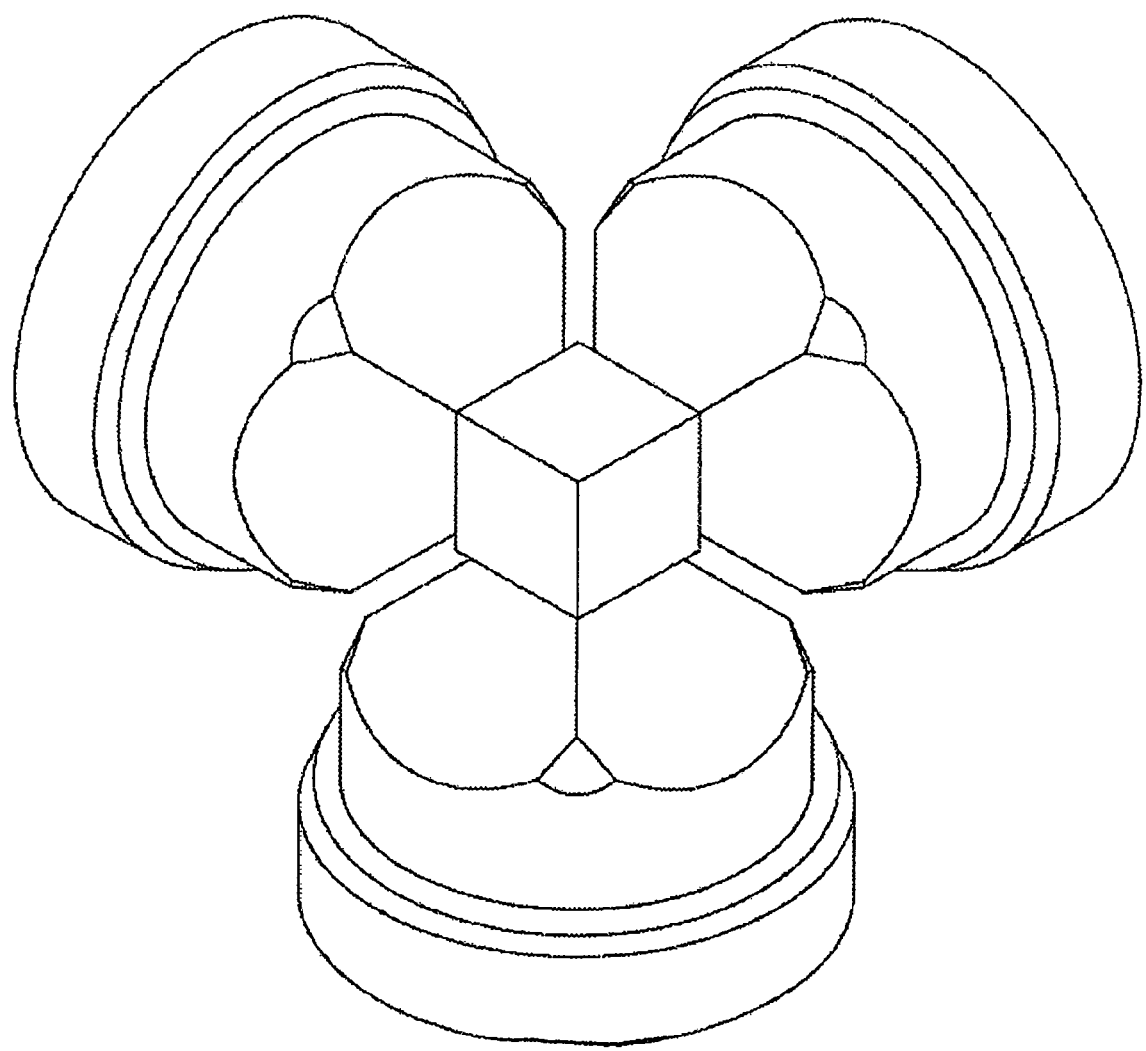
FIG. 1 is a sketch showing three of the six pistons, each in the form of a frustum of a pyramid, which are combined in a cubic-type multi-anvil high-pressure apparatus.

In the present invention, a gallium nitride powder is compressed in a high-temperature high-pressure generator. High-temperature high-pressure generators that can be employed are a belt apparatus, an opposed anvil apparatus, and a multi-anvil apparatus such as a cubic-type multi-anvil apparatus. FIG. 1 illustrates a cubic-type multi-anvil apparatus that may be employed to implement the present invention; in the apparatus, six pistons each in the form a frustum of a pyramid which are fabricated from a cemented carbide (and generally referred to as anvils), of which only three are depicted in FIG. 1, are combined such that a pressure medium in cubic form is compressed three-dimensionally. A sample of gallium nitride powder is packed into the pressure medium together with a high-temperature generating pyrogen and compressed.

The sample is placed under a pressure of at least $6 \times 10^6$ atm. and heated to at least $2,200°$ C. so that gallium nitride undergoes congruent melting. In order that gallium nitride will not decompose into the constituent elements at the elevated temperature, a high pressure of at least $6 \times 10^6$ atm. is required; in addition, in order to be melted, gallium nitride must be heated to at least $2,200°$ C. which is its melting at the stated high pressure. At high-pressure conditions exceeding $10^5$ atm., it is difficult to secure large volumes of sample and this is unsuitable for the purposes of the present invention.

Sample holders that can withstand those high-temperature high-pressure conditions are preferably made of boron nitride, graphite, diamond or molybdenum- or tungsten-based refractory materials. The molten gallium nitride is cooled slowly so that it is recrystallized to yield single-crystal gallium nitride.

The present invention is further described below with reference to the following example which is provided for illustrative purposes only and is by no means intended to limit the scope of the invention.

EXAMPLE

A gallium nitride powder comprising particles with an average size of no more than 0.1 μm and having a purity of 99.99% is compressed into tablets, each of which was placed in a boron nitride sample holder and compressed up to $6 \times 10^4$ atm. at room temperature by means of a cubic-type multi-anvil high-temperature high-pressure generator. With the pressure held at $6 \times 10^4$ atm., the sample temperature was increased to 2,100° C. at a rate of about 100° C. per minute and then up to 2,300° C. at a rate of 10° C. per minute, whereby the sample was melted. Thereafter, the sample temperature was lowered to 2,100° C. at a rate of 1° C. per minute. The sample was further cooled down to room temperature at a rate of 50° C. per minute. The pressure in the apparatus was reverted to one atmosphere, whereupon a clear single crystal of gallium nitride was produced.

INDUSTRIAL APPLICABILITY

The single-crystal gallium nitride of the invention is useful as a semiconductor substrate for blue light emitting devices.

What is claimed is:

1. A process for producing single-crystal gallium nitride comprising the steps of performing congruent melting of gallium nitride at a high pressure between $6 \times 10^4$ atm. and $10 \times 10^4$ atm. and at a high temperature between 2,200° C. and 2,500° C. and then slowly cooling the obtained gallium nitride melt at the stated high pressure.

2. A process for producing single-crystal gallium nitride comprising the steps of
   compressing gallium nitride powder to a pressure between $6 \times 10^4$ atm. and $10 \times 10^4$ atm. at room temperature to form a shape;
   maintaining the pressure and heating the shaped gallium nitride to 2,300° C. to melt it; and cooling the melted gallium nitride to room temperature to obtain a clear single crystal used as a semiconductor substrate for blue light-emitting devices.

3. The process of claim 2 wherein the gallium nitride powder comprises particles with an average size of no more than 0.1 µm.

4. The process of claim 2 wherein the shaped gallium nitride is heated to 2,100° C. at a rate of about 100° C. per minute and then heated to 2,300° C. at a rate of 10° C. per minute to melt it.

5. The process of claim 2 wherein the melted gallium nitride is cooled to 2,100° C. at a rate of 1° C. per minute, then at a rate of 50° C. per minute.

6. The process of claim 3 wherein the shaped gallium nitride is heated to 2,100° C. at a rate of about 100° C. per minute and then heated to 2,300° C. at a rate of 10° C. per minute to melt it.

7. The process of claim 3 wherein the melted gallium nitride is cooled to 2,100° C. at a rate of 1° C. per minute, then at a rate of 50° C. per minute.

8. The process of claim 4 wherein the melted gallium nitride is cooled to 2,100° C. at a rate of 1° C. per minute, then at a rate of 50° C. per minute.

9. The process of claim 6 wherein the melted gallium nitride is cooled to 2,100° C. at a rate of 1° C. per minute, then at a rate of 50° C. per minute.

10. The process of claim 2 wherein the pressure is exerted by a cubic-type multi-anvil high temperature high-pressure generator.

11. The process of claim 3 wherein the pressure is exerted by a cubic-type multi-anvil high temperature high-pressure generator.

12. The process of claim 4 wherein the pressure is exerted by a cubic-type multi-anvil high temperature high-pressure generator.

13. The process of claim 5 wherein the pressure is exerted by a cubic-type multi-anvil high temperature high-pressure generator.

14. The process of claim 6 wherein the pressure is exerted by a cubic-type multi-anvil high temperature high-pressure generator.

15. The process of claim 7 wherein the pressure is exerted by a cubic-type multi-anvil high temperature high-pressure generator.

16. The process of claim 8 wherein the pressure is exerted by a cubic-type multi-anvil high temperature high-pressure generator.

17. The process of claim 9 wherein the pressure is exerted by a cubic-type multi-anvil high temperature high-pressure generator.

18. A process for producing single-crystal gallium nitride comprising:
   compressing a gallium nitride to a pressure between $6 \times 10^4$ atm. and $10 \times 10^4$ atm. at room temperature;
   heating the gallium nitride to 2,300° C. until melted, while maintaining the pressure; and
   cooling the melted gallium nitride to room temperature to obtain a single crystal.

* * * * *